United States Patent
Ito

(10) Patent No.: US 8,203,188 B2
(45) Date of Patent: Jun. 19, 2012

(54) SPLIT GATE OXIDES FOR A LATERALLY DIFFUSED METAL OXIDE SEMICONDUCTOR (LDMOS)

(75) Inventor: Akiro Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 123 days.

(21) Appl. No.: 12/457,745

(22) Filed: Jun. 19, 2009

(65) Prior Publication Data

US 2010/0295125 A1 Nov. 25, 2010

Related U.S. Application Data

(60) Provisional application No. 61/213,278, filed on May 22, 2009.

(51) Int. Cl.
*H01L 29/76* (2006.01)
(52) U.S. Cl. ......................... 257/411; 257/406
(58) Field of Classification Search .................. 257/406, 257/411
See application file for complete search history.

(56) References Cited

U.S. PATENT DOCUMENTS

| | | | |
|---|---|---|---|
| 5,501,996 A * | 3/1996 | Yang et al. | |
| 5,742,084 A | 4/1998 | Yu | |
| 5,801,416 A * | 9/1998 | Choi et al. | |
| 5,910,673 A | 6/1999 | Hsu et al. | |
| 5,918,133 A * | 6/1999 | Gardner et al. | |
| 5,943,575 A | 8/1999 | Chung | |
| 6,034,388 A | 3/2000 | Brown et al. | |
| 6,077,749 A * | 6/2000 | Gardner et al. | |
| 6,121,666 A | 9/2000 | Burr | |
| 6,177,324 B1 | 1/2001 | Song et al. | |
| 6,200,843 B1 * | 3/2001 | Bryant et al. | |
| 6,204,537 B1 | 3/2001 | Ma | |
| 6,211,552 B1 | 4/2001 | Efland et al. | |
| 6,242,787 B1 * | 6/2001 | Nakayama et al. | 257/493 |
| 6,424,005 B1 * | 7/2002 | Tsai et al. | |
| 6,441,431 B1 * | 8/2002 | Efland et al. | 257/335 |
| 6,465,307 B1 * | 10/2002 | Chidambaram et al. | |
| 6,580,156 B1 | 6/2003 | Ito et al. | |
| 6,620,656 B2 * | 9/2003 | Min et al. | |
| 6,700,176 B2 | 3/2004 | Ito et al. | |
| 6,707,112 B2 * | 3/2004 | Kachelmeier | |
| 6,798,684 B2 | 9/2004 | Low et al. | |
| 6,888,205 B2 * | 5/2005 | Moscatelli et al. | |
| 6,960,819 B2 | 11/2005 | Chen et al. | |
| 7,161,213 B2 | 1/2007 | Ito et al. | |
| 7,345,341 B2 * | 3/2008 | Lin et al. | |
| 7,348,247 B2 * | 3/2008 | Park | |
| 7,405,443 B1 | 7/2008 | Zuniga et al. | |
| 7,405,446 B2 * | 7/2008 | Agam et al. | 257/360 |
| 7,462,906 B2 * | 12/2008 | Lu et al. | 257/316 |
| 7,528,453 B2 | 5/2009 | Holz et al. | |
| 7,602,017 B2 * | 10/2009 | Cai | |
| 7,855,144 B2 | 12/2010 | Kim et al. | |

(Continued)

*Primary Examiner* — Eugene Lee
(74) *Attorney, Agent, or Firm* — Sterne, Kessler, Goldstein & Fox P.L.L.C.

(57) ABSTRACT

An apparatus is disclosed to increase a breakdown voltage of a semiconductor device. The semiconductor device includes a first heavily doped region to represent a source region. A second heavily doped region represents a drain region of the semiconductor device. A third heavily doped region represents a gate region of the semiconductor device. The semiconductor device includes a gate oxide positioned between the source region and the drain region, below the gate region. The semiconductor device uses a split gate oxide architecture to form the gate oxide. The gate oxide includes a first gate oxide having a first thickness and a second gate oxide having a second thickness.

37 Claims, 10 Drawing Sheets

U.S. PATENT DOCUMENTS

| | | |
|---|---|---|
| 2002/0072159 A1* | 6/2002 | Nishibe et al. ............... 438/179 |
| 2003/0127689 A1 | 7/2003 | Hebert |
| 2004/0157379 A1 | 8/2004 | Ito et al. |
| 2005/0052892 A1 | 3/2005 | Low et al. |
| 2005/0236666 A1 | 10/2005 | Wang |
| 2006/0124999 A1 | 6/2006 | Pendharkar |
| 2006/0261408 A1* | 11/2006 | Khemka et al. ............... 257/335 |
| 2008/0023760 A1* | 1/2008 | Ito et al. ........................ 257/335 |
| 2008/0036033 A1 | 2/2008 | Ito et al. |
| 2008/0054375 A1 | 3/2008 | Williford |
| 2008/0164537 A1* | 7/2008 | Cai ............................... 257/408 |
| 2008/0246080 A1 | 10/2008 | Ito et al. |
| 2009/0032868 A1 | 2/2009 | Chen et al. |
| 2010/0090278 A1 | 4/2010 | Röhrer |
| 2010/0096697 A1* | 4/2010 | Su et al. ........................ 257/343 |
| 2010/0295126 A1 | 11/2010 | Ito |
| 2011/0057271 A1 | 3/2011 | Ito et al. |
| 2011/0169077 A1 | 7/2011 | Ito |
| 2011/0303978 A1 | 12/2011 | Ito |

* cited by examiner

SPLIT GATE OXIDES FOR A LATERALLY DIFFUSED METAL OXIDE SEMICONDUCTOR (LDMOS)

CROSS-REFERENCE TO RELATED APPLICATIONS

The present application claims the benefit of U.S. Provisional Patent Appl. No. 61/213,278, filed May 22, 2009, entitled "Gate Oxides for a Laterally Diffused Metal Oxide Semiconductor (LDMOS)," which is incorporated herein by reference in its entirety.

FIELD OF THE INVENTION

The present invention generally relates to a laterally diffused metal oxide semiconductor (LDMOS). More specifically, the invention relates to increasing a breakdown voltage of the LDMOS.

BACKGROUND OF THE INVENTION

Silicon semiconductor processing has evolved sophisticated operations for fabricating integrated circuits. As advancement in fabrication process technology continues, operating voltages of integrated circuits have decreased, but operating voltages of auxiliary devices remain the same. The auxiliary devices are devices used in conjunction with the integrated circuits, such as, printers, scanners, disk drives, tape drives, microphones, speakers, and cameras to provide some examples.

An integrated circuit may include an interconnected array of active and passive elements, such as, transistors, resistors, capacitors, inductors to provide some examples, integrated with or deposited on a substrate by a continuous series of compatible processes. The auxiliary devices may operate at voltages above a breakdown voltage of the transistors contained within the integrated circuit. As the operating voltages applied to the transistors increase, the transistors will eventually breakdown allowing an uncontrollable increase in current. Breakdown voltage is a voltage level where this uncontrollable increase in current occurs. Examples of breakdown may include punch-through, avalanche breakdown, and gate oxide breakdown to provide some examples. Operating above the breakdown voltage for a significant duration reduces the lifetime of the transistors.

Techniques are currently available to increase the voltage at which the breakdown occurs. These techniques may include separate design of input-output circuits using a high voltage process, double diffused drain or other extended drain techniques, or cascading of individual transistors to provide some examples. However, these techniques often increase the fabrication cost and/or complexity by requiring additional process steps along with additional substrate masking.

What is needed is a metal oxide semiconductor field effect transistor (MOSFET) device that addresses one or more of the aforementioned shortcomings of conventional MOSFET devices.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 2:
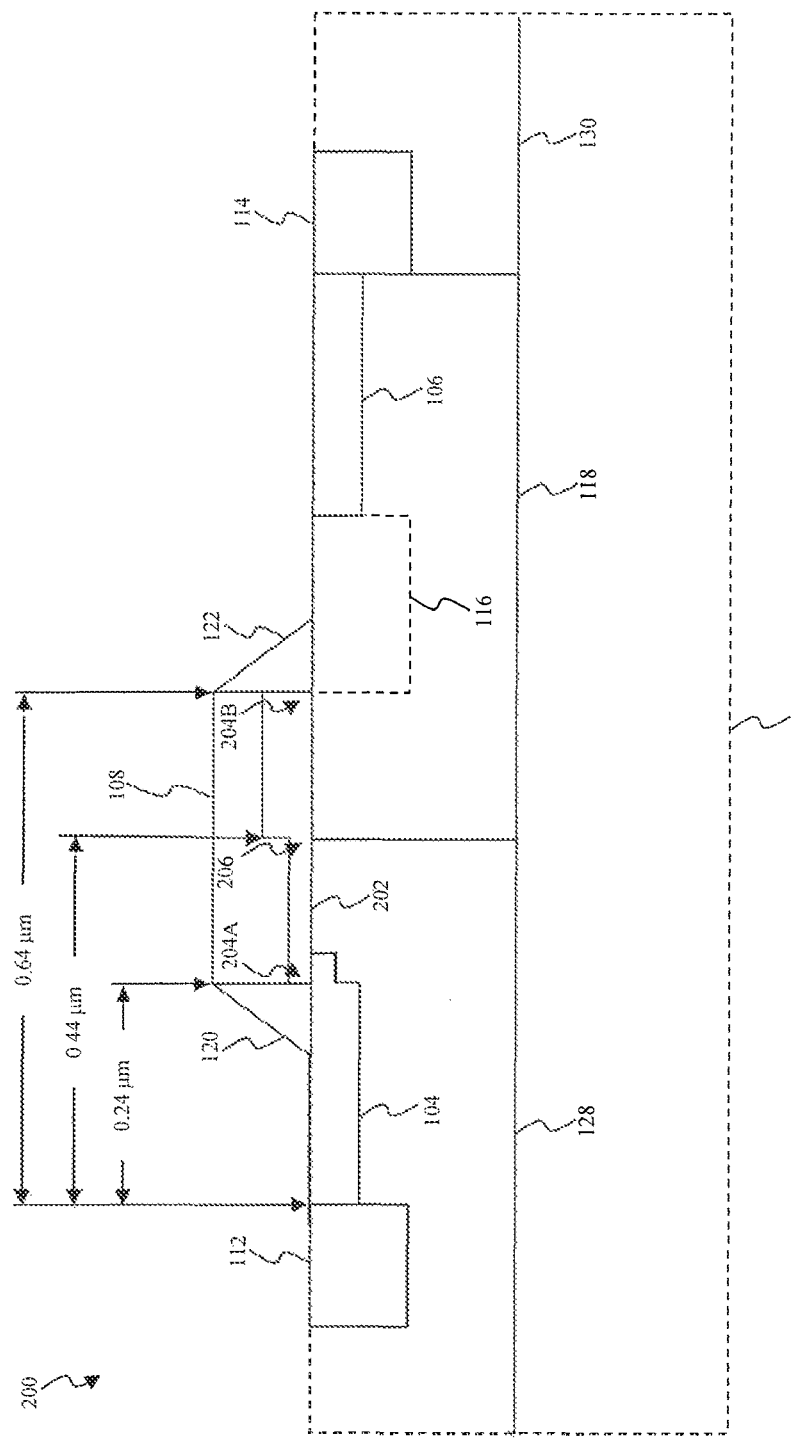

FIG. 2 further illustrates the cross-sectional view of the n-type LDMOS according to an exemplary embodiment of the present invention.

Figure 3A:
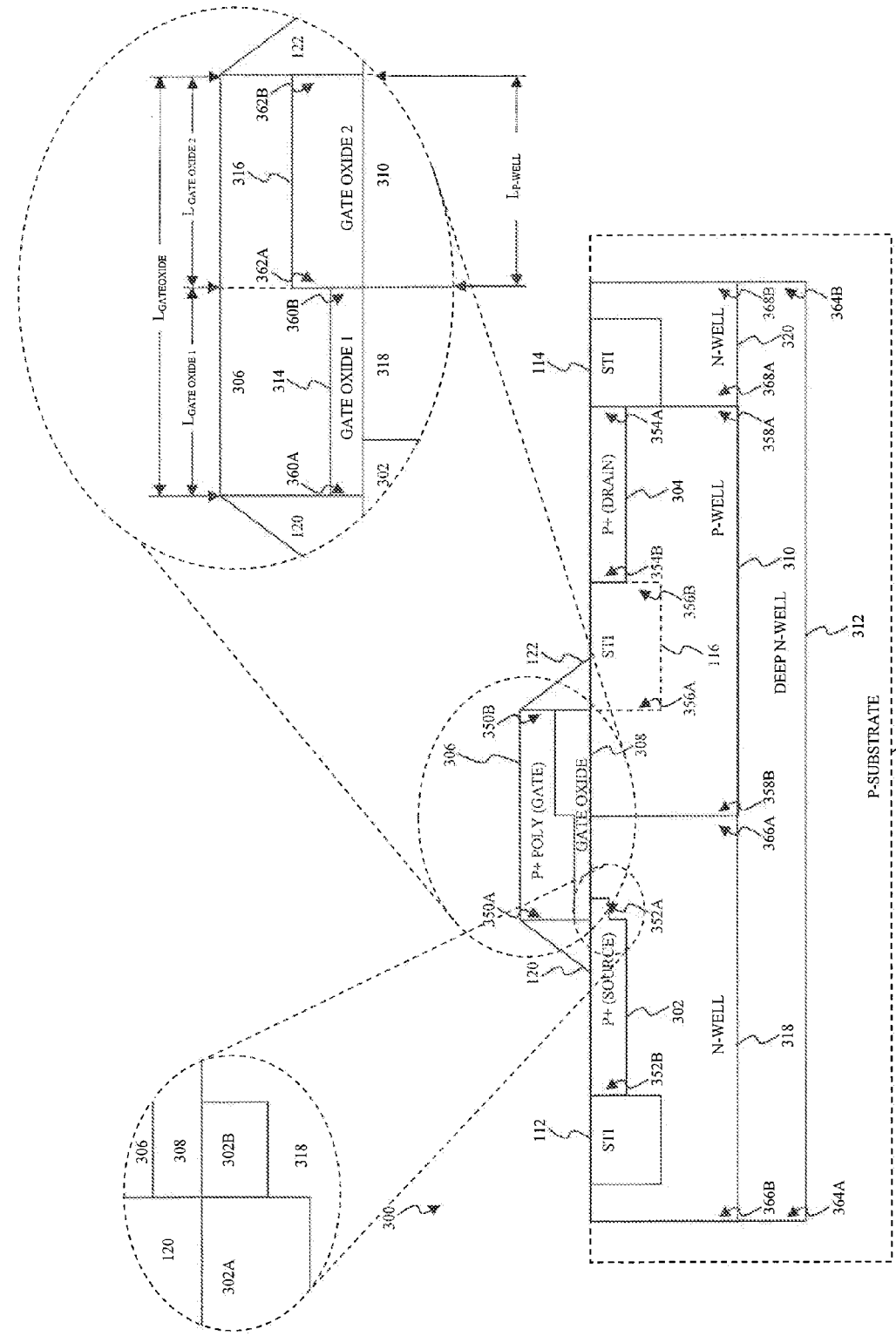

FIG. 3A illustrates a first cross-sectional view of a p-type laterally diffused metal oxide semiconductor (LDMOS) according to a first exemplary embodiment of the present invention.

Figure 3B:
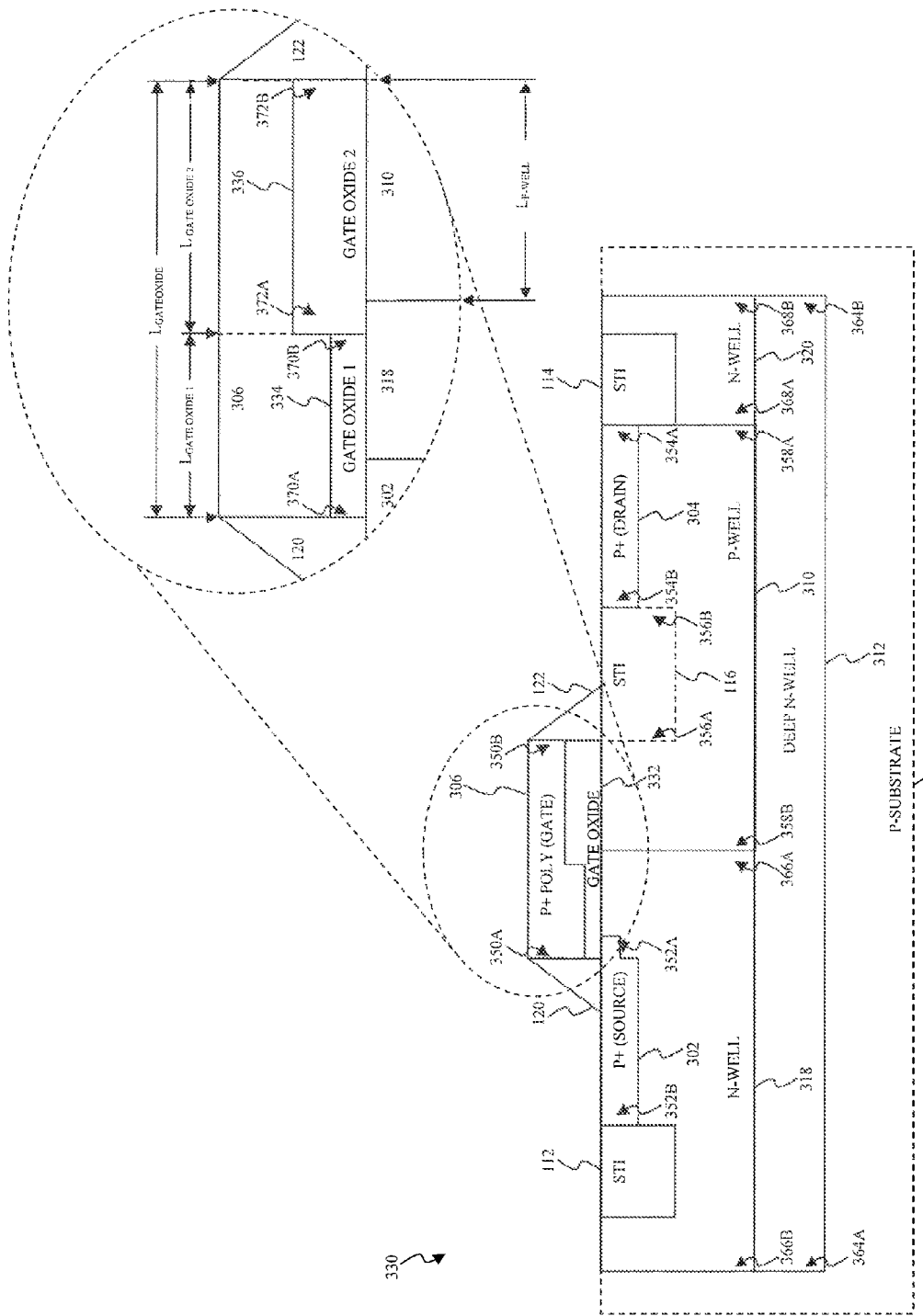

FIG. 3B illustrates a second cross-sectional view of the p-type LDMOS according to a second exemplary embodiment of the present invention.

Figure 3C:
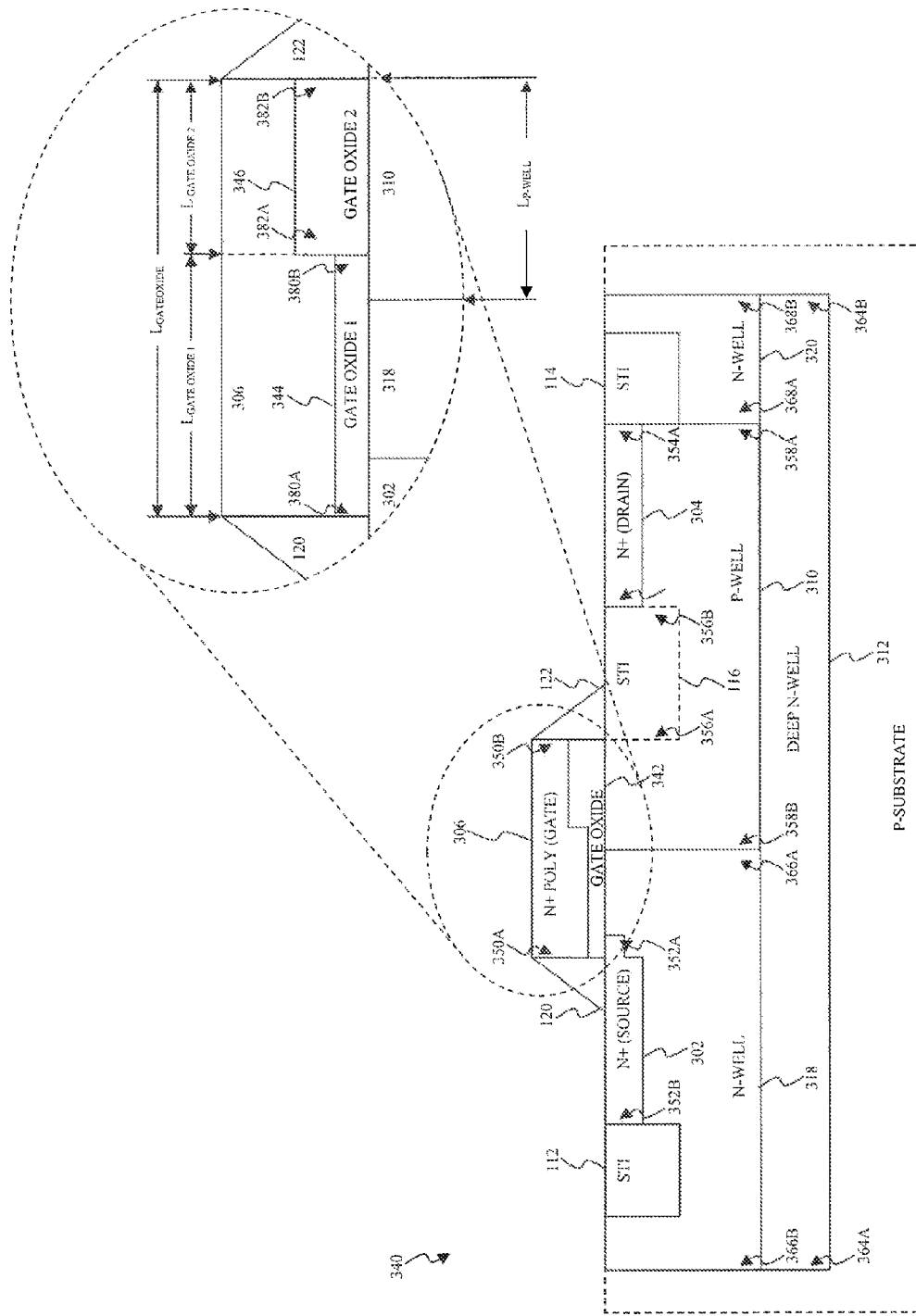

FIG. 3C illustrates a third cross-sectional view of the n-type LDMOS according to a third exemplary embodiment of the present invention.

Figure 4:
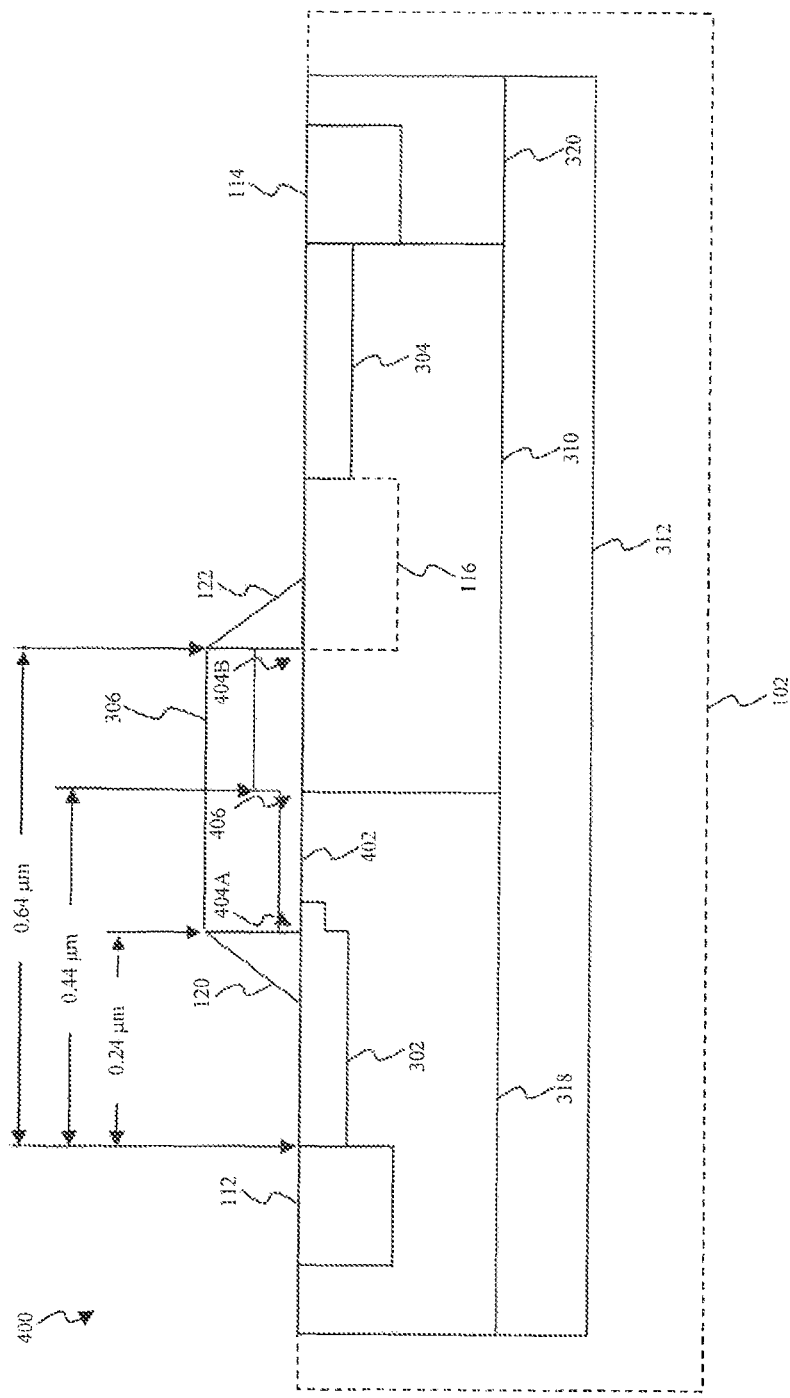

FIG. 4 further illustrates the cross-sectional view of the p-type LDMOS according to an exemplary embodiment of the present invention.

Figure 5:
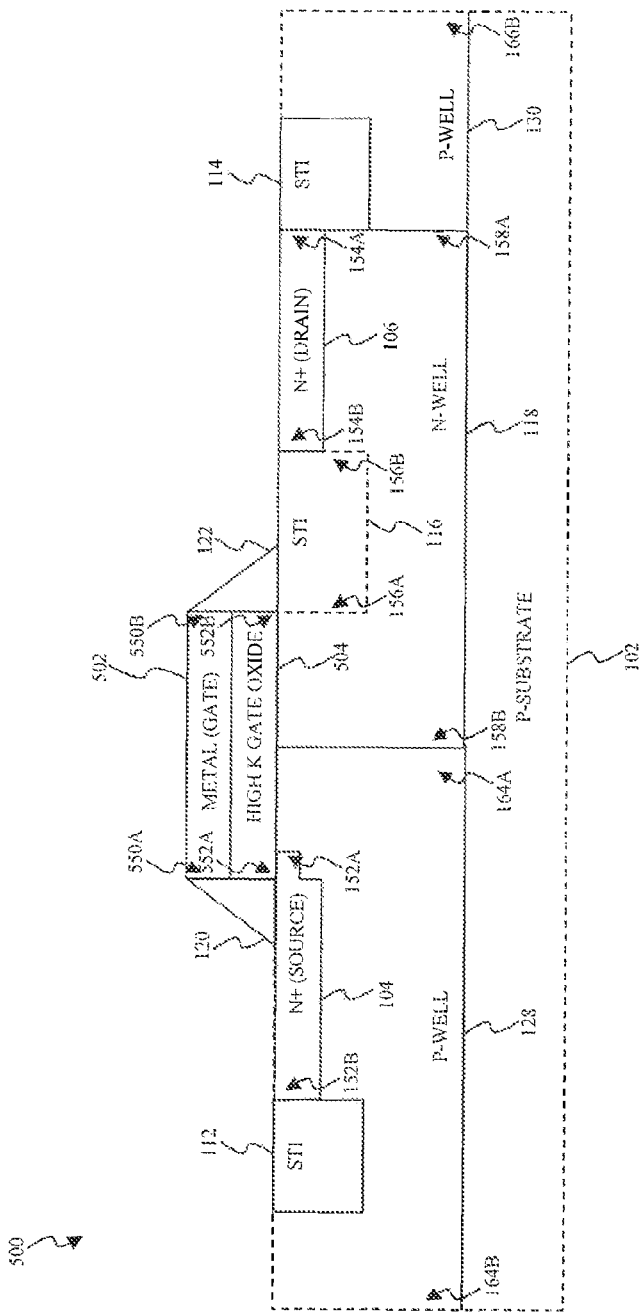

FIG. 5 illustrates a fourth cross-sectional view of the n-type LDMOS according to a fourth exemplary embodiment of the present invention.

Figure 6:
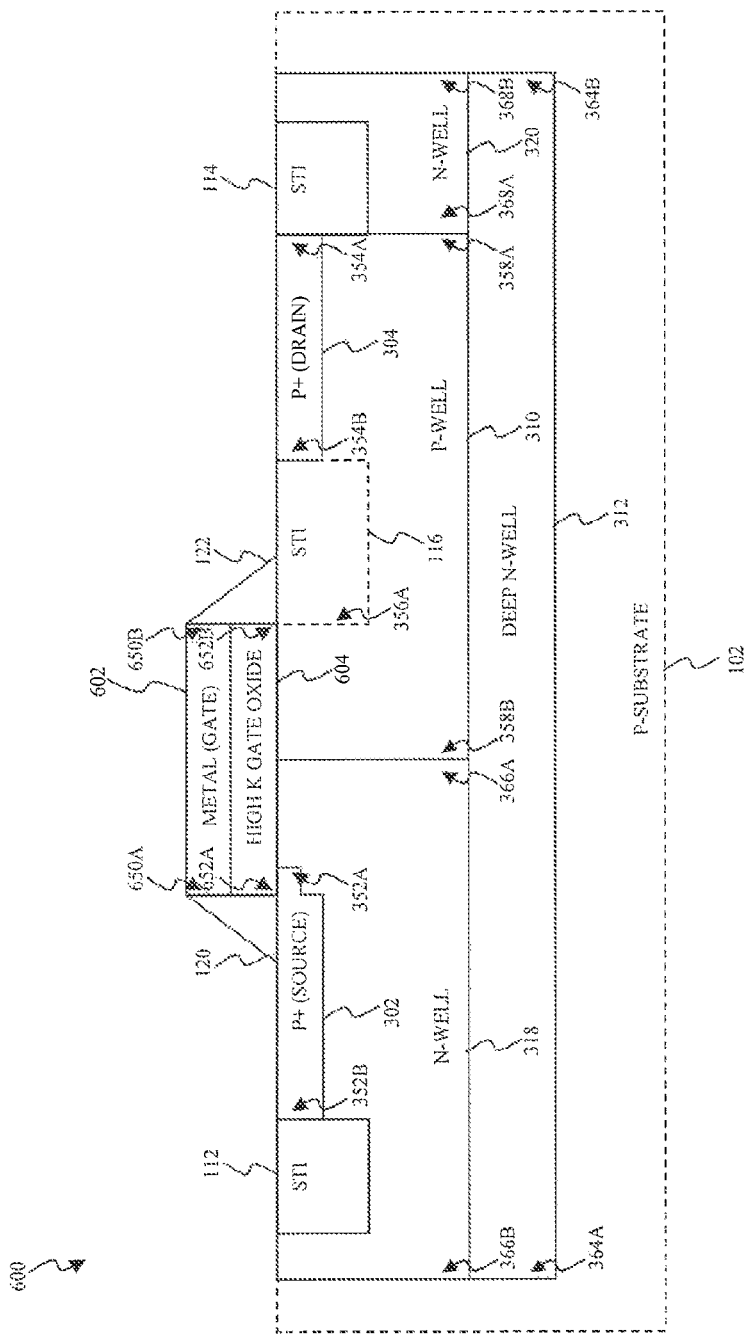

FIG. 6 illustrates a fourth cross-sectional view of the p-type LDMOS according to a fourth exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described. Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner.

The exemplary embodiments described herein are provided for illustrative purposes, and are not limiting. Other exemplary embodiments are possible, and modifications may be made to the exemplary embodiments within the spirit and scope of the present invention. Therefore, the Detailed Description is not meant to limit the present invention. Rather, the scope of the present invention is defined only in accordance with the following claims and their equivalents.

The following Detailed Description of the exemplary embodiments will so fully reveal the general nature of the present invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

The example embodiments described herein are provided for illustrative purposes, and are not limiting. Further structural and operational embodiments, including modifications/alterations, will become apparent to persons skilled in the relevant art(s) from the teachings herein.

A. Split Gate Oxide Architecture

Figure 1A:
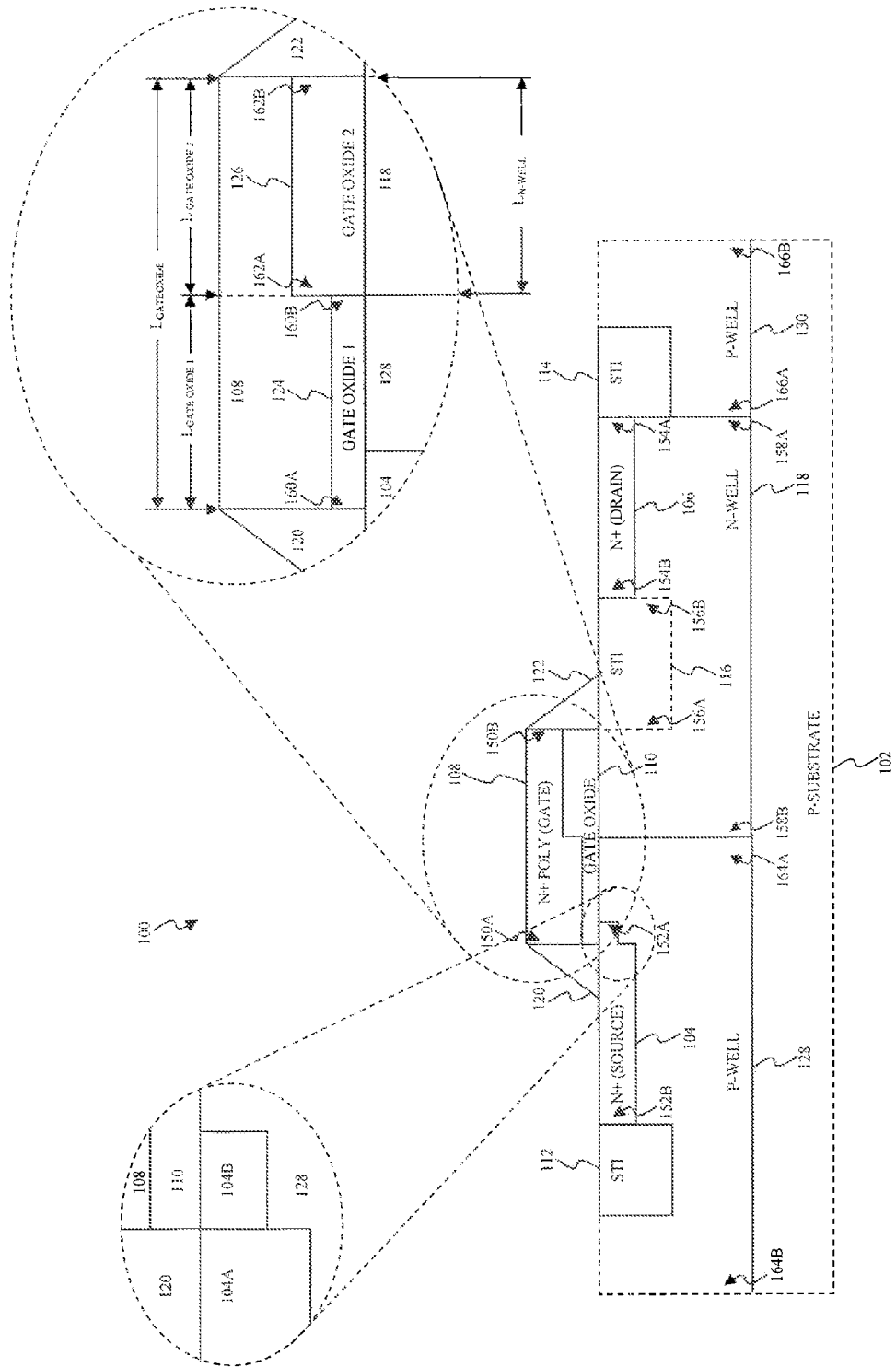
FIG. 1A illustrates a first cross-sectional view of an n-type laterally diffused metal oxide semiconductor (LDMOS) according to a first exemplary embodiment of the present invention.

FIG. 1A illustrates a first cross-sectional view of an n-type laterally diffused metal oxide semiconductor (LDMOS) according to a first exemplary embodiment of the present invention. An n-type LDMOS structure 100 is formed onto a substrate 102 of one conductivity type. The substrate 102 represents a physical material on which the n-type LDMOS structure 100 is formed. For example, the n-type LDMOS structure 100 may be formed in the substrate 102 consisting of a p-type material. The p-type material includes impurity atoms of an acceptor type that are capable of accepting an electron, such as, but not limited to, boron or aluminum to provide some examples.

A first heavily doped region of substantially opposite conductivity as the substrate 102 represents a source region 104 of the n-type LDMOS structure 100. Generally, implanting a comparatively small number of atoms, approximately $$\frac{5 \times 10^{18}}{cm^3} \text{ to } \frac{1 \times 10^{19}}{cm^3},$$

refers to an implanting that is low or light. Similarly, implanting a comparatively large number of atoms, $$\frac{1 \times 10^{19}}{cm^3} \text{ to } \frac{5 \times 10^{20}}{cm^3},$$

refers to an implanting that is high or heavy. Alternatively, the source region 104 may include a first source region 104A and a second source region 104B. The first source region 104A represents the first heavily doped region of substantially opposite conductivity as the substrate 102 while the second source region 104B represents a lightly doped region of substantially opposite conductivity as the substrate 102, also referred to as an LDD region.

A second heavily doped region of substantially opposite conductivity as the substrate 102 represents a drain region 106 of the n-type LDMOS structure 100. For example, the source region 104 and the drain region 106 may be implanted with N+ material to form a first N+ region corresponding to the source region 104 and a second N+ region corresponding to the drain region 106, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The n-type material includes impurity atoms of a donor type that are capable of donating an electron, such as, but not limited to, phosphorus, arsenic, or antimony to provide some examples.

A third heavily doped region of substantially opposite conductivity as the substrate 102 represents a gate region 108 of the n-type LDMOS structure 100. A polycrystalline silicon may heavily implanted with a substantially opposite conductivity as the substrate 102 to form the gate region 108. For example, the polycrystalline silicon may be implanted with N+ material to form an N+ poly region corresponding to the gate region 108. The gate region 108 is positioned between the source region 104 and the drain region 106. More specifically, as shown in FIG. 1A, a first side 150A of the gate region 108 may be formed above the source region 104 such that at least some of the gate region 108 substantially overlaps the source region 104 by a first substantially horizontal distance. It should be understood that relative spatial descriptions between one or more particular features, structures, or characteristics (e.g., "vertically aligned," "contact," etc.) used herein are for purposes of illustration only, and that practical implementations of the structures described herein may include fabrication or misalignment tolerances without departing from the spirit and scope of the present invention. A first side 152A of the source region 104 may extend beyond the first side 150A of the gate region 108 by the first substantially horizontal distance such that at least some of the source region 104 is below at least some of the gate region 108. Alternatively, the first side 150A of the gate region 108 may be substantially vertically aligned with the first side 152A of the source region 104 such that no substantial overlap exists between the source region 104 and the gate region 108. In another alternate, the first side 152A of the source region 104 may be positioned a second substantially horizontal distance from the first side 150A of the gate region 108 such that none of the source region 104 is below the gate region 108. The second substantially horizontal distance separates the first side 150A of the gate region 108 with the first side 152A of the source region 104. A second side 154B of the drain region 106 may be positioned, or displaced, a substantially horizontal distance from a second side 150B of the gate region 108.

A gate oxide 110 serves as an insulator between the gate region 108 and a channel region of the substrate 102 that is between the source region 104 and the drain region 106. The gate oxide 110 is positioned below and/or in contact with the gate region 108, between the source region 104 and the drain region 106. The gate oxide 110 may be formed using a dielectric material such as silicon dioxide ($SiO_2$), though any suitable material may be used. The gate oxide 110 is described in further detail below.

A first shallow trench isolation (STI) region 112 and a second STI region 114 may provide isolation and/or protection for the n-type LDMOS structure 100 from neighboring active and passive elements integrated with and/or formed on the substrate 102. The first STI region 112 may be positioned adjacent to and/or in contact with a second side 152B of the source region 104. Likewise, the second STI region 114 may be positioned adjacent to and/or in contact with a first side 154A of the drain region 106. Alternatively, the n-type LDMOS structure 100 may optionally include a third STI region 116 positioned between the gate region 108 and the drain region 106. The third STI region 116 may include a first side 156A positioned substantially vertically aligned with a second side 150B of the gate region 108 such that no substantial overlap exists between the gate region 108 and the third STI region 116. Alternatively, the first side 156A of the third STI region 116 may be positioned below the gate region 108 causing the third STI region 116 to substantial overlap the gate region 108. More specifically, as shown in FIG. 1A, the first side 156A of the third STI region 116 may be formed below the gate region 108 such that at least some of the third STI region 116 substantially overlaps the gate region 108 by a substantially horizontal distance. The third STI region 116 extends from the first side 156A to a second side 156B positioned adjacent to and/or in contact with the second side 154B of the drain region 106. The first STI region 112, the second STI region 114, and/or the third STI region 116 may be formed using a dielectric material such as $SiO_2$, though any suitable material may be used.

A specially implanted n-type region, known as an n-well 118, may be positioned below the drain region 106 and the gate region 108. The substrate 102 may be implanted with the n-type material to form the n-well 118. As shown in FIG. 1A, the n-well 118 may include a first side 158A being substantially vertically aligned with the first side 154A of the drain region 106. The n-well 118 may extend from the first side 158A to a second side 158B positioned below the gate region 108 such that the n-well 118 extends below at least some of the gate region 108 and substantially all of the drain region 106. Alternatively, the first side 158A of the n-well 118 may be positioned below the drain region 106. The n-well 118 may extend from the first side 158A to the second side 158B such that the n-well 118 extends below at least some of the gate region 108 and at least some of the drain region 106. In another alternate, the first side 158A of the n-well 118 may be positioned below the second STI region 114 or extend beyond the second STI region 114. The n-well 118 may extend from the first side 158A to the second side 158B such that the n-well 118 extends below at least some of the gate region 108, substantially all of the drain region 106, and at least some of the second STI region 114.

A first specially implanted p-type region, known as p-well 128 may be positioned below the source region 104 and the gate region 108. The substrate 102 may be implanted with the p-type material to form the p-well 128. As shown in FIG. 1A, the p-well 128 may include a first side 164A being in contact with the second side 158B of the n-well 118. The p-well 128 may extend from the first side 164A to a second side 164B such that the p-well 128 extends below at least some of the gate region 108 and substantially all of the source region 104 and the first STI region 112. Alternatively, the second side 164B of the p-well 128 may be positioned below the first STI region 112. The p-well 128 may extend from the first side 164A to the second side 164B such that the p-well 128 extends below at least some of the gate region 108, substantially all of the source region 104, and at least some of the first STI region 112. A second specially implanted p-type region, known as p-well 130 may be positioned below the second STI region 114. The substrate 102 may be implanted with the p-type material to form the p-well 130. As shown in FIG. 1A, the p-well 130 may include a first side 166A being in contact with the first side 158A of the n-well 118. The p-well 130 may extend from the first side 166A to a second side 166B such that the p-well 130 extends below substantially all of the second STI region 114. Alternatively, the second side 166B of the p-well 130 may be positioned below the second STI region 114. The p-well 130 may extend from the first side 166A to the second side 166B such that the p-well 130 extends below at least some of the second STI region 114.

The n-type LDMOS structure 100 may include a spacer 120 above the source region 104 and/or adjacent to the gate region 108 to isolate and/or protect the source region 104 and the gate region 108 and a spacer 122 between the drain region 106 and the second side 150B of the gate region 108 to isolate and/or protect the drain region 106 and the gate region 108. The spacer 120 and/or the spacer 122 may be formed using a dielectric material, such as $SiO_2$, though any suitable material may be used.

A p-n junction is a potential barrier created by combining the n-type and the p-type material. A first interface between the substrate 102 and the source region 104 may represent a first p-n junction. Likewise, a second interface between the substrate 102 and the drain region 106 only or a combination of the drain region 106 and the n-well 118 may represent a second p-n junction. The first p-n junction and/or the second p-n junction may prevent current conduction from the source region 104 to the drain region 106 upon the application of a voltage from the source region 104 to the drain region 106. On the other hand, applying a first potential, such as a positive direct current (DC) voltage to provide an example, to the gate region 108 and a second potential, such as a ground potential to provide an example, to the source region 104 may cause a voltage to appear between the gate region 108 and the source region 104. The first potential on the gate region 108 repels the positively charged carrier holes below the gate region 108 forming a channel region between the source region 104 and the drain region 106 in the n-type LDMOS structure 100.

The channel region represents a carrier-depletion region populated by a negative charge formed below the gate oxide 110 by an electric field. The electric field attracts carrier electrons from the source region 104 and the drain region 106 into the channel region. An n-type region connecting the source region 104 to the drain region 106 forms after a sufficient number of the carrier electrons accumulate in the channel region allowing current to flow from the source region 104 to the drain region 106. However, there is a point, known as the breakdown voltage, where the current passing through the channel region increases uncontrollably resulting in breakdown. Examples of breakdown may include avalanche breakdown, punch-through, and/or gate oxide breakdown to provide some examples.

Gate oxide breakdown, also known as oxide rupture or oxide punch-through, refers to destruction of the gate oxide 110. The gate oxide breakdown results from a build-up of defects inside the gate oxide 110 which eventually leads to a creation of a conductive path in the gate oxide 110 from the gate region 108 to the channel region. For example, a hot carrier effect may cause the defects inside the gate oxide 110. The hot carrier effect refers to an effect of high energy carrier electrons and/or carrier holes generated as a result of impact ionization at the channel region. These high energy current carriers may leave the substrate 102 and may, upon reaching a sufficiently high level of energy, tunnel into the gate oxide 110 to cause the defects.

The gate oxide breakdown commences by the formation of the defects in the gate oxide 110. At first, the defects are relatively small in number and do not form the conductive path in the gate oxide 110. As the number of defects in the gate oxide 110 increase, they eventually reach a point at which the conductive path forms in the gate oxide 110 causing a soft breakdown. Movement of electrons from the channel region to the gate region 108 via the conductive path in the gate oxide 110 further heats up the gate oxide 110, which further increases the current flow through the conductive path. This increase in heat leads to more defects in the gate oxide 110, thereby enlarging the conductive path and/or causing new conductive paths to form in the gate oxide 110. As a result of the enlarged the conductive path and/or the new conductive paths, more defects form in the gate oxide 110 eventually leading to a hard breakdown of the gate oxide 110. The hard breakdown of the gate oxide 110 causes the gate oxide 110 to melt resulting in one or more permanent conductive paths in the gate oxide 110 from the channel region to the gate region 108.

The n-type LDMOS structure 100 may be formed using a complementary metal oxide silicon (CMOS) logic foundry technology. The CMOS logic foundry technology may include one or more minimum design rules corresponding to one or more operating voltages. The minimum design rules represent minimum sizes of components of n-type LDMOS structure 100 and/or distances between the components of the n-type LDMOS structure 100 in accordance with the CMOS logic foundry. The CMOS logic foundry technology may include a specialized set of minimum design rules, such as a first set of minimum design rules for a low operating voltage process and/or a second set of minimum design rules for a high operating voltage process to provide some examples, for a corresponding operating voltage. Typically, the low operating voltage process is used for lower power devices with thinner gate oxides when compared with the high operating voltage process.

A conventional LDMOS device may be formed with the CMOS logic foundry technology using a combination of the low operating voltage process and the high operating voltage process or solely the high operating voltage process. In both of these situations, however, a gate oxide layer, in its entirety, of the conventional LDMOS is formed using a thick gate oxide corresponding to the high operating voltage process. For example, the gate oxide layer of the conventional LDMOS device may be formed using the thick gate oxide having a thickness of 40 angstrom (Å). The thick gate oxide increases the breakdown voltage of the conventional LDMOS device when compared to a thin gate oxide of the low operating voltage process. For example, the thin gate oxide of the low operating voltage process may have a thickness of 20 Å, to provide an example. However, an area of the thick gate oxide corresponding to the second set of minimum design rules for the high operating voltage process is greater than an area of the thin gate oxide corresponding to the first set of minimum design rules for the low operating voltage process. As a result of an increased area of the thick gate oxide, the conventional LDMOS device having the thick gate oxide is approximately 20% larger than an equivalent device having the thin gate oxide.

To mimic the increased breakdown voltage of the thick gate oxide, without the increase in size of the conventional LDMOS device, the gate oxide 110 of the n-type LDMOS structure 100 uses a split gate oxide architecture. As shown in FIG. 1A, the gate oxide 110 includes a first portion, referred to as a first gate oxide 124, having a first thickness and a second portion, referred to as a second gate oxide 126, having a second thickness. In an exemplary embodiment, the first thickness may be approximately equal to the thin gate oxide of the low operating voltage process and the second thickness may be approximately equal to the thick gate oxide of the high operating voltage process. For example, the first thickness may be approximately 20 Å and the second thickness may be approximately 40 Å.

From the discussion above, the gate oxide 110 is positioned below the gate region 108, between the source region 104 and the drain region 106. The gate oxide 110 may extend from a first side positioned adjacent to and/or in contact with the spacer 120 to a second side positioned adjacent to and/or in contact with the spacer 122 for a length of $L_{GATE\ OXIDE}$. The length of the gate oxide 110 may be represented as:

$$L_{GATE\ OXIDE} = L_{GATE\ OXIDE\ 1} + L_{GATE\ OXIDE\ 2}, \quad (1)$$

where $L_{GATE\ OXIDE}$ represents the length of the gate oxide 110, $L_{GATE\ OXIDE\ 1}$ represents a length of the first gate oxide 124, namely a first horizontal distance from the first side 160A of the first gate oxide 124 to the second side 160B of the first gate oxide 124, and $L_{GATE\ OXIDE\ 2}$ represents a length of the second gate oxide 126, namely a second horizontal distance from a first side 162A of the second gate oxide 126 to a second side 162B of the second gate oxide 126.

The first gate oxide 124 may include the first side 160A positioned adjacent to and/or in contact with the spacer 120 and/or substantially vertically aligned with the first side 150A of the gate region 108. The first gate oxide 124 may extend from the first side 160A, above at least some of the source region 104, and above at least some of the substrate 102 to the second side 160B for the length of $L_{GATE\ OXIDE\ 1}$. The second side 160B of the gate oxide 124 may be positioned adjacent to and/or in contact with the first side 162A of the second gate oxide 126 to form an oxide junction. The oxide junction may be vertically aligned with the second side 158B of the n-well 118. The second gate oxide 126 may extend above at least some of the n-well 118 to the second side 162B for the length of $L_{GATE\ OXIDE\ 2}$. The length of $L_{GATE\ OXIDE\ 1}$ may be substantially equal to the length of $L_{GATE\ OXIDE\ 2}$. The second side 162B of the second gate oxide 126 may be adjacent to and/or contact the spacer 122 and/or substantially vertically aligned with the second side 150B of the gate region 108.

The length $L_{N-WELL}$ represents a substantially horizontal distance between the second side 150B of the gate region 108 and the second side 158B of the n-well 118. In other words, the length $L_{N-WELL}$ represents a length of substantial overlap between the gate region 108 and the n-well 118. The length of $L_{GATE\ OXIDE\ 2}$ may be substantially equal to a length $L_{GATE\ OXIDE\ 1}$. As a result, the first side 162A of the second gate oxide 126 may be vertically aligned with the second side 158B of the n-well 118.

Figure 1B:
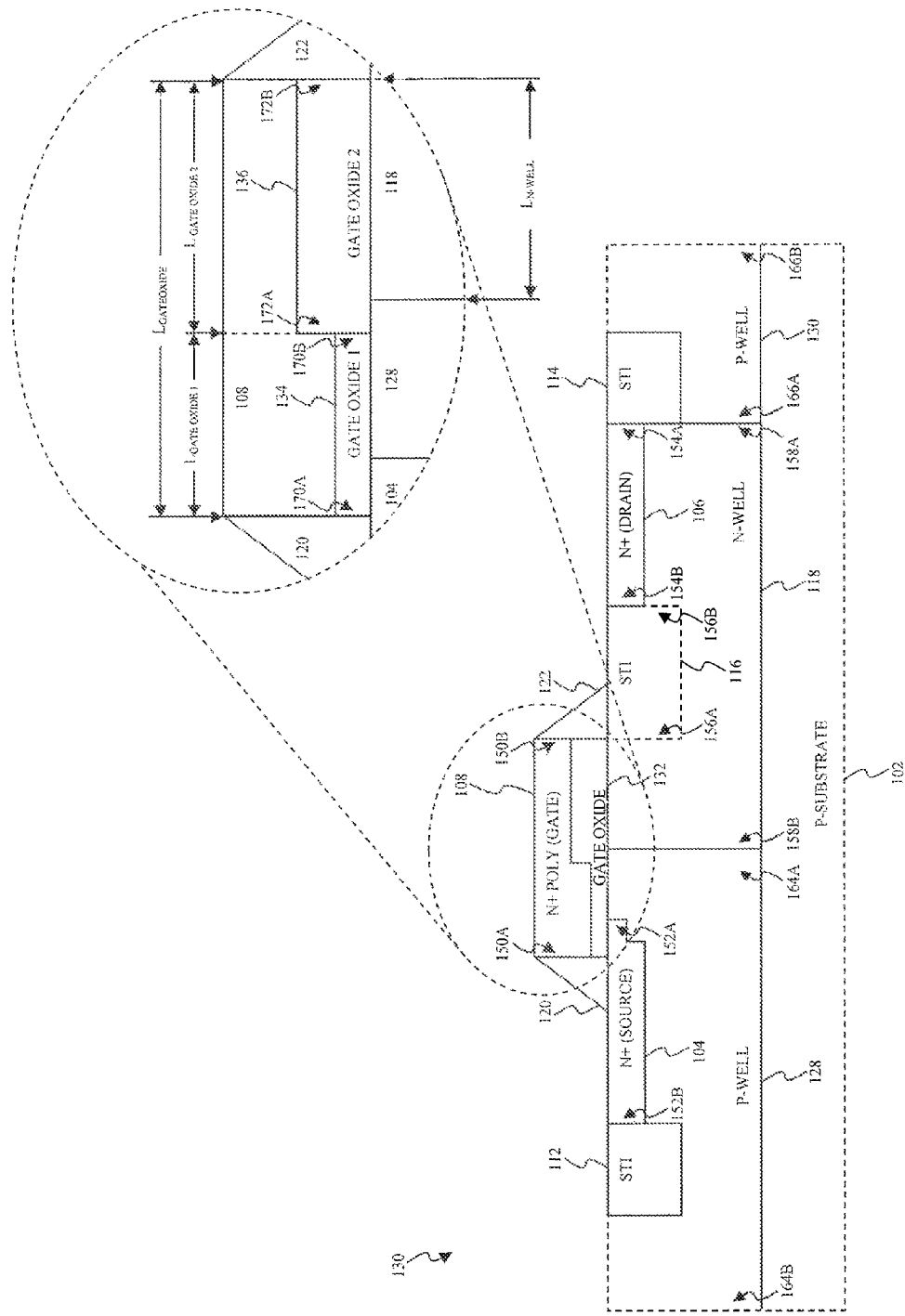
FIG. 1B illustrates a second cross-sectional view of the n-type LDMOS according to a second exemplary embodiment of the present invention.

FIG. 1B illustrates a second cross-sectional view of the n-type LDMOS according to a second exemplary embodiment of the present invention. The n-type LDMOS structure 130 is substantially similar to the n-type LDMOS structure 100 as described above. Therefore, only differences between the n-type LDMOS structure 100 and the n-type LDMOS structure 130 are to be described in further detail.

As shown in FIG. 1B, the n-type LDMOS structure 130 includes a gate oxide 132. The gate oxide 132 includes a first portion, referred to as a first gate oxide 134, and a second portion, referred to as a second gate oxide 136. The first gate oxide 134 and the second gate oxide 136 are substantially similar to first gate oxide 124 and the second gate oxide 126 as described above, therefore, only differences are to be described in further detail.

The first gate oxide 134 may include a first side 170A positioned adjacent to and/or in contact with the spacer 120 and/or substantially vertically aligned with the first side 150A of the gate region 108. The first gate oxide 134 may extend from the first side 170A, above at least some of the source region 104, and above at least some of the substrate 102 to a second side 170B for the length of $L_{GATE\ OXIDE\ 1}$. The second side 170B of the gate oxide 134 may be positioned adjacent to and/or in contact with a first side 172A of the second gate oxide 136 to form an oxide junction. The oxide junction may be positioned above and/or in contact with the p-well 128.

The second gate oxide 136 may extend above at least some of the p-well 128 and above at least some of the n-well 118 to a second side for the length of $L_{GATE\ OXIDE\ 2}$. The length of $L_{GATE\ OXIDE\ 1}$ may be substantially less than the length of $L_{GATE\ OXIDE\ 2}$. The second side 172B of the second gate oxide 136 may be adjacent to and/or contact the spacer 122 and/or substantially vertically aligned with the second side 150B of the gate region 108.

The length of $L_{GATE\ OXIDE\ 2}$ may be substantially greater than the length $L_{N-WELL}$. As a result, the first side 172A of the second gate oxide 136 may extend beyond the second side 158B of the n-well 118 by a substantially horizontal distance represented as a difference between the length $L_{GATE\ OXIDE\ 2}$ and the length $L_{N-WELL}$. In other words, the first side 172A of the second gate oxide 136 may substantially overlap the substrate 102 by this substantially horizontal distance.

Figure 1C:
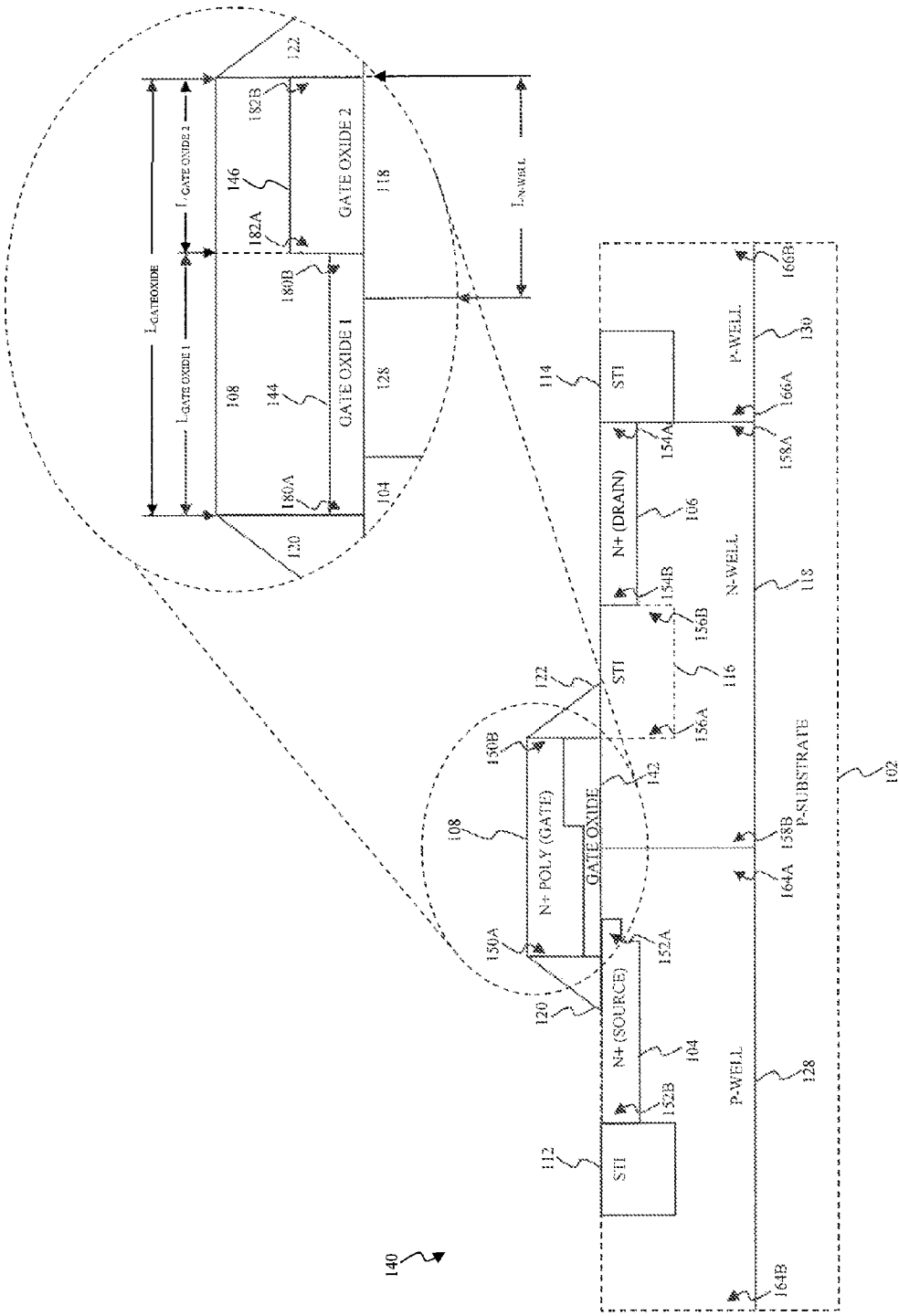
FIG. 1C illustrates a third cross-sectional view of the n-type LDMOS according to a third exemplary embodiment of the present invention.

FIG. 1C illustrates a third cross-sectional view of the n-type LDMOS according to a third exemplary embodiment of the present invention. The n-type LDMOS structure 140 is substantially similar to the n-type LDMOS structure 100 as described above. Therefore, only differences between the n-type LDMOS structure 100 and the n-type LDMOS structure 140 are to be described in further detail.

As shown in FIG. 1C, the n-type LDMOS structure 140 includes a gate oxide 142. The gate oxide 142 includes a first portion, referred to as a first gate oxide 144, and a second portion, referred to as a second gate oxide 146. The first gate oxide 144 and the second gate oxide 146 are substantially similar to first gate oxide 124 and the second gate oxide 126 as described above, therefore, only differences are to be described in further detail.

The first gate oxide 144 may include a first side 180A positioned adjacent to and/or in contact with the spacer 120 and/or substantially vertically aligned with the first side 150A of the gate region 108. The first gate oxide 144 may extend from the first side 180A, above at least some of the source region 104, above at least some of the substrate 102, and above at least some of the n-well 118 to a second side 180B for the length of $L_{GATE\ OXIDE\ 1}$. The second side 180B of the first gate oxide 144 may be positioned adjacent to and/or in contact with a first side 182A of the second gate oxide 146 to form an oxide junction. The oxide junction may be positioned above the n-well 118. The second gate oxide 146 may extend above at least some of the n-well 118 to a second side 182B for the length of $L_{GATE\ OXIDE\ 2}$. The length of $L_{GATE\ OXIDE\ 1}$ may be substantially greater than the length of $L_{GATE\ OXIDE\ 2}$. The second side 182B of the second gate oxide 146 may be adjacent to and/or contact the spacer 122 and/or substantially vertically aligned with the second side 150B of the gate region 108.

The length of $L_{GATE\ OXIDE\ 2}$ may be substantially less than the length $L_{N-WELL}$. As a result, the second side 180B of the first gate oxide 144 may extend beyond the second side 158B of the n-well 118 by a substantially horizontal distance represented as a difference between the length $L_{GATE\ OXIDE\ 2}$ and the length $L_{N-WELL}$. In other words, the second side 180B of the first gate oxide 144 may substantially overlap the n-well 118 by this substantially horizontal distance.

FIG. 2 further illustrates the cross-sectional view of the n-type LDMOS according to an exemplary embodiment of the present invention. An LDMOS structure 200 represents an exemplary embodiment of the n-type LDMOS structure 100. However, those skilled in the relevant arts will recognize that the n-type LDMOS structure 140 and/or the n-type LDMOS structure 160 may be formed differently in accordance with the teaching herein without departing from the spirit and scope of the present invention. The LDMOS structure 200 may be fabricated using a 65 nm minimum design rule foundry technology. However, those skilled in the relevant arts will recognize that the n-type LDMOS structure 100 may be fabricated using any suitable minimum design rule foundry technology without departing from the spirit and scope of the present invention.

From the discussion above, the CMOS logic foundry technology may include a specialized set of minimum design rules, such as the first set of minimum design rules for the low operating voltage process and/or the second set of minimum design rules for the high operating voltage process to provide some examples, for a corresponding operating voltage. For example, the CMOS logic foundry technology may include a first set of minimum design rules for a low operating voltage process of 1.2V, also referred to as a 1.2V process, and a high operating voltage process of 3.3V, also referred to as a 3.3V process. As another example, the CMOS logic foundry technology may include a first set of minimum design rules for a low operating voltage process of 1.2V, and a high operating voltage process of 2.5V, also referred to as a 2.5V process. Typically, the low operating voltage process is used for lower power devices with thinner gate oxides when compared with the high operating voltage process using a thicker gate oxide.

The gate region 108 and the gate oxide 202 may be formed at a first substantially horizontal distance from the source region 104. The gate oxide 202 may represent an exemplary embodiment of the gate oxide 110, the gate oxide 132, or the gate oxide 142 to provide some examples. As such, the gate oxide 202 may include a first gate oxide, such as the first gate oxide 124, the first gate oxide 134, or the first gate oxide 144 to provide some examples, and a second gate oxide, such as, the second gate oxide 126, the second gate oxide 136, or the second gate oxide 146 to provide some examples. More specifically, the CMOS logic foundry technology may be used to fabricate the first side 150A of the gate region 108 and/or a first side 204A of the gate oxide 202 at a substantially horizontal distance of approximately 0.24 μm from the second side 152B of the source region 104.

The second side 158B of the n-well 118 and an oxide junction 206 may be formed at a second substantially horizontal distance from the source region 104. The oxide junction 206 represents a region in the gate oxide 202 where the first gate oxide comes into substantial contact with the second gate oxide. More specifically, the CMOS logic foundry technology may fabricate the oxide junction 206 at a distance of approximately 0.44 μm from the second side 152B of the source region 104 such that the oxide junction 206 is approximately 0.2 μm from the first side 204A of the first gate oxide as shown in FIG. 1A. Alternatively, the CMOS logic foundry technology may fabricate the oxide junction 206 at a distance of approximately less than 0.44 μm from the second side 152B of the source region 104 such that the oxide junction 206 is less than 0.2 μm from the first side 204A of the first gate oxide as shown in FIG. 1B. In another alternate, the CMOS logic foundry technology may fabricate the oxide junction 206 at a distance of approximately more than 0.44 Jim from the second side 152B of the source region 104 such that the oxide junction 206 is more than 0.2 μm from the first side 204A of the first gate oxide as shown in FIG. 1C.

The second side 150B of the gate region 108 and/or a second side 204B of the gate oxide 202 may be formed at a third substantially horizontal distance from the source region 104. More specifically, the CMOS logic foundry technology may be used to fabricate the second side 150B of the gate region 108 and/or the second side 204A of the gate oxide 202 at a substantially horizontal distance of approximately 0.64 μm from the second side 152B of the source region 104.

FIG. 3A illustrates a first cross-sectional view of a p-type laterally diffused metal oxide semiconductor (LDMOS) according to a first exemplary embodiment of the present invention. The p-type LDMOS structure 300 may be formed in the substrate 102 of one conductivity type. The p-type LDMOS structure 300 is substantially similar to the n-type LDMOS structure 100 as described above. Therefore, only differences between the n-type LDMOS structure 100 and the p-type LDMOS structure 300 are to be described in further detail.

A first heavily doped region of substantially similar conductivity as the substrate 102 represents a source region 302 of the p-type LDMOS structure 300. Alternatively, the source region 302 may include a first source region 302A and a second source region 302B. The first source region 302A represents the first heavily doped region of substantially similar conductivity as the substrate 102 while the second source region 302B represents a lightly doped region of substantially similar conductivity as the substrate 302, also referred to as an LDD region. A second heavily doped region of substantially opposite conductivity as the substrate 102 represents a drain region 304 of the p-type LDMOS structure 300. The source region 302 and the drain region 304 may be implanted with P+ material to form a first P+ region corresponding to the source region 302 and a second P+ region corresponding to the drain region 304.

A third heavily doped region of substantially opposite conductivity as the substrate 102 represents a gate region 306 of the p-type LDMOS structure 300. The gate region 306 is positioned between the source region 302 and the drain region 304. More specifically, as shown in FIG. 3A, a first side 350A of the gate region 306 may be formed above the source region 302 such that the gate region 306 substantially overlaps the source region 302. In other words, a first side 352A of the source region 302 may extend beyond the first side 350A of the gate region 306 such that at least some of the source region 302 is below at least some of the gate region 306. Alternatively, the first side 350A of the gate region 306 may be substantially vertically aligned with the first side 352A of the source region 302 such that no substantial overlap exists between the source region 302 and the gate region 306. In another alternate, the first side 352A of the source region 302 may be positioned prior to the first side 350A of the gate region 306 such that none of the source region 302 is below the gate region 306. In other words, a substantially horizontal distance separates the first side 350A of the gate region 306 with the first side 352A of the source region 302. A polycrystalline silicon may be heavily implanted with the substantially opposite conductivity as the substrate 102 to form the gate region 306. The polycrystalline silicon may be heavily implanted with P+ material to form a P+ poly region corresponding to the gate region 306.

A gate oxide 308 serves as an insulator between the gate region 306 and a channel region between the source region 302 and the drain region 304. The gate oxide 308 is positioned below the gate region 306, between the source region 302 and the drain region 304. The gate oxide 308 may be formed using a dielectric material such as $SiO_2$, though any suitable material may be used. The gate oxide 308 is described in further detail below.

A specially implanted p-type region, known as a p-well 310, may be positioned below the drain region 304, and the gate region 306. The p-well 310 may be formed by implanting the substrate 102 with the p-type material. As shown in FIG. 3A, the p-well 310 may include a first side 358A being substantially vertically aligned with a first side 354A of the drain region 304. The p-well 310 may extend from the first side 358A to a second side 358B positioned below the gate region 306 such that the p-well 310 extends below at least some of the gate region 306 and substantially all of the drain region 304. Alternatively, the first side 358A of the p-well 310 may be positioned below the drain region 304. The p-well 310 may extend from the first side 358A to the second side 358B such that the p-well 310 extends below at least some of the gate region 306 and at least some of the drain region 304. In another alternate, the first side 358A of the p-well 310 may be positioned below the second STI region 114 or extend beyond the second STI region 114. The p-well 310 may extend from the first side 358A to the second side 358B such that the p-well 310 extends below at least some of the gate region 306, substantially all of the drain region 304, and at least some of the second STI region 114.

A first specially implanted n-type region, known as n-well 318 may be positioned below the source region 302 and the gate region 306. The substrate 102 may be implanted with the n-type material to form the n-well 318. As shown in FIG. 3A, the n-well 318 may include a first side 366A being in contact with the second side 358B of the p-well 310. The n-well 318 may extend from the first side 366A to a second side 366B such that the n-well 318 extends below at least some of the gate region 306 and substantially all of the source region 302 and the first STI region 112. Alternatively, the second side 366B of the n-well 318 may be positioned below the first STI region 112. The n-well 318 may extend from the first side 366A to the second side 366B such that the n-well 318 extends below at least some of the gate region 306, substantially all of the source region 302, and at least some of the first STI region 112. A second specially implanted p-type region, known as n-well 320 may be positioned below the second STI region 114. The substrate 102 may be implanted with the n-type material to form the n-well 320. As shown in FIG. 3A, the n-well 320 may include a first side 368A being in contact with the first side 358A of the p-well 310. The n-well 320 may extend from the first side 368A to a second side 368B such that the n-well 320 extends below substantially all of the second STI region 114. Alternatively, the second side 368B of the n-well 320 may be positioned below the second STI region 114. The n-well 320 may extend from the first side 368A to the second side 368B such that the n-well 320 extends below at least some of the second STI region 114.

The p-type LDMOS structure 300 includes a deep n-well 312 formed in the substrate 102. The substrate 102 may be implanted with the n-type material to form the deep n-well 312. As shown in FIG. 3A, a first side 364A of the deep n-well 312 is separated from the first STI region 112 by a first substantially horizontal distance. The deep n-well 312 may extend from the first side 364A to a second side 364B of the deep n-well 312 such that the deep n-well 312 extends below substantially all of the first STI region 112, substantially all of the source region 302, substantially all of the drain region 304, substantially all of the gate region 306, and substantially all of the second STI region 114. The second side 364B of the deep n-well 312 is separated from the second STI region 114 by a second substantially horizontal distance. Alternately, the first side 364A of the deep n-well 312 may be positioned below the first STI region 112 such that the deep n-well 312 extends below at least some of the first STI region 112, substantially all of the source region 302, substantially all of the drain region 304, substantially all of the gate region 306, and substantially all of the second STI region 114. In another alternate, the second side 364B of the deep n-well 312 may be positioned below the second STI region 114 such that the deep n-well 312 extends below substantially all of the first STI region 112, substantially all of the source region 302, substantially all of the drain region 304, substantially all of the gate region 306, and at least some of the second STI region 114.

To mimic the increased breakdown voltage of the thick gate oxide, without the increase in size of the conventional LDMOS device, as described above, the gate oxide 308 of the p-type LDMOS structure 300 uses the split gate oxide architecture. As shown in FIG. 3A, the gate oxide 308 includes a first portion, referred to as a first gate oxide 314, having a first thickness and a second portion, referred to as a second gate oxide 316, having a second thickness. In an exemplary embodiment, the first thickness may be approximately equal to the thin gate oxide of the low operating voltage process and the second thickness may be approximately equal to the thick gate oxide of the high operating voltage process. In another exemplary embodiment, the first thickness may be approximately 20 Å and the second thickness may be approximately 40 Å.

From the discussion above, the gate oxide 308 is positioned below the gate region 306, between the source region 302 and the drain region 304. The gate oxide 308 may extend from a first side positioned adjacent to and/or in contact with the spacer 120 to a second side positioned adjacent to and/or in contact with the spacer 122 for the length of $L_{GATE\ OXIDE}$.

The first gate oxide 314 may include a first side 360A positioned adjacent to and/or in contact with the spacer 120 and/or substantially vertically aligned with the first side 350A of the gate region 306. The first gate oxide 314 may extend from the first side 360A, above at least some of the source region 302, and above at least some of the deep n-well 312 to a second side 360B for the length of $L_{GATE\ OXIDE\ 1}$. The second side 360B of the first gate oxide 314 may be positioned adjacent to and/or in contact with a first side 362A of the second gate oxide 316 to form an oxide junction. The oxide junction may be vertically aligned with the second side 358B of the p-well 310. The second gate oxide 316 may extend above at least some of the p-well 310 to a second side 362B for the length of $L_{GATE\ OXIDE\ 2}$. The length of $L_{GATE\ OXIDE\ 1}$ may be substantially equal to the length of $L_{GATE\ OXIDE\ 2}$. The second side 362B of the second gate oxide 316 may be adjacent to and/or contact the spacer 122 and/or substantially vertically aligned with the second side 350B of the gate region 306.

The length $L_{P\text{-}WELL}$ represents a substantially horizontal distance between the second side 350B of the gate region 306 and the second side 358B of the p-well 310. In other words, the length $L_{P\text{-}WELL}$ represents a length of substantial overlap between the gate region 306 and the p-well 310. The length of $L_{GATE\ OXIDE\ 2}$ may be substantially equal to a length $L_{P\text{-}WELL}$. As a result, the first side 362A of the second gate oxide 316 may be vertically aligned with the second side 358B of the p-well 310.

FIG. 3B illustrates a second cross-sectional view of the p-type LDMOS according to a second exemplary embodiment of the present invention. The p-type LDMOS structure 330 is substantially similar to the p-type LDMOS structure 300 as described above. Therefore, only differences between the p-type LDMOS structure 300 and the p-type LDMOS structure 330 are to be described in further detail.

As shown in FIG. 3B, the p-type LDMOS structure 330 includes a gate oxide 332. The gate oxide 332 includes a first portion, referred to as a first gate oxide 334, and a second portion, referred to as a second gate oxide 336. The first gate oxide 334 and the second gate oxide 336 are substantially similar to first gate oxide 314 and the second gate oxide 316 as described above. Therefore, only differences are to be described in further detail.

The first gate oxide 334 may include a first side 370A positioned adjacent to and/or in contact with the spacer 120 and/or substantially vertically aligned with the first side 350A of the gate region 306. The first gate oxide 334 may extend from the first side 370A, above at least some of the source region 302, and above at least some of the deep n-well 312 to a second side 370B for the length of $L_{GATE\ OXIDE\ 1}$. The second side 370B of the first gate oxide 334 may be positioned adjacent to and/or in contact with a first side 372A of the second gate oxide 336 to form an oxide junction. The oxide junction may be positioned above the n-well 318. The second gate oxide 336 may extend above at least some of the n-well 318 and above at least some of the p-well 310 to a second side 374B for the length of $L_{GATE\ OXIDE\ 2}$. The length of $L_{GATE\ OXIDE\ 1}$ may be substantially less than the length of $L_{GATE\ OXIDE\ 2}$. The second side 372B of the second gate oxide 336 may be adjacent to and/or contact the spacer 122 and/or substantially vertically aligned with the second side 350B of the gate region 306.

The length of $L_{GATE\ OXIDE\ 2}$ may be substantially greater than the length $L_{N\text{-}WELL}$. As a result, the first side 372A of the second gate oxide 336 may extend beyond the second side 358B of the p-well 310 by a substantially horizontal distance represented as a difference between the length $L_{GATE\ OXIDE\ 2}$ and the length $L_{N\text{-}WELL}$. In other words, the first side 372A of the second gate oxide 336 may substantial overlap the deep n-well 312 by this substantially horizontal distance.

FIG. 3C illustrates a third cross-sectional view of the n-type LDMOS according to a third exemplary embodiment of the present invention. The p-type LDMOS structure 340 is substantially similar to the p-type LDMOS structure 300 as described above. Therefore, only differences between the p-type LDMOS structure 300 and the p-type LDMOS structure 340 are to be described in further detail.

As shown in FIG. 3C, the p-type LDMOS structure 340 includes a gate oxide 342. The gate oxide 342 includes a first portion, referred to as a first gate oxide 344, and a second portion, referred to as a second gate oxide 346. The first gate oxide 344 and the second gate oxide 346 are substantially similar to first gate oxide 314 and the second gate oxide 316 as described above. Therefore, only differences are to be described in further detail.

The first gate oxide 344 may include a first side 380A positioned adjacent to and/or in contact with the spacer 120 and/or substantially vertically aligned with the first side 350A of the gate region 306. The first gate oxide 344 may extend from the first side 380A, above at least some of the source region 302, above at least some of the deep n-well 312, and above at least some of the p-well 310 to a second side 380B for the length of $L_{GATE\ OXIDE\ 1}$. The second side 380B of the second gate oxide 346 may be positioned adjacent to and/or in contact with a first side 382A of the second gate oxide 346 to form an oxide junction. The oxide junction may be positioned above the p-well 310. The second gate oxide 346 may extend above at least some of the p-well 310 to a second side 382B for the length of $L_{GATE\ OXIDE\ 2}$. The length of $L_{GATE\ OXIDE\ 1}$ may be substantially greater than the length of $L_{GATE\ OXIDE\ 2}$. The second side 382B of the second gate oxide 346 may be adjacent to and/or contact the spacer 120 and/or substantially vertically aligned with the second side 350B of the gate region 306.

The length of $L_{GATE\ OXIDE\ 2}$ may be substantially lesser than the length $L_{N\text{-}WELL}$. As a result, the second side 380B of the first gate oxide 344 may extend beyond the second side 358B of the p-well 310 by a substantially horizontal distance represented as a difference between the length $L_{GATE\ OXIDE\ 1}$ and the length $L_{N\text{-}WELL}$. In other words, the second side 380B of the first gate oxide 344 may substantial overlap the p-well 310 by this substantially horizontal distance.

FIG. 4 further illustrates the cross-sectional view of the p-type LDMOS according to an exemplary embodiment of the present invention. An LDMOS structure 400 represents an exemplary embodiment of the p-type LDMOS structure 300. However, those skilled in the relevant arts will recognize that the p-type LDMOS structure 340 and/or the p-type LDMOS structure 360 may be formed differently in accordance with the teaching herein without departing from the spirit and scope of the present invention. The LDMOS structure 400 may be fabricated using a 65 nm minimum design rule foundry technology. However, those skilled in the relevant arts will recognize that the p-type LDMOS structure 300 may be fabricated using any suitable minimum design rule foundry technology without departing from the spirit and scope of the present invention.

From the discussion above, the CMOS logic foundry technology may include a specialized set of minimum design rules, such as the first set of minimum design rules for the low operating voltage process and/or the second set of minimum design rules for the high operating voltage process to provide some examples, for a corresponding operating voltage. For example, the CMOS logic foundry technology may include a first set of minimum design rules for a low operating voltage process of 1.2V, also referred to as a 1.2V process, and a high operating voltage process of 3.3V, also referred to as a 3.3V process. As another example, the CMOS logic foundry technology may include a first set of minimum design rules for a low operating voltage process of 1.2V, and a high operating voltage process of 2.5V, also referred to as a 2.5V process. Typically, the low operating voltage process is used for lower power devices with thinner gate oxides when compared with the high operating voltage process using a thicker gate oxide.

The gate region 306 and the gate oxide 402 may be formed at a first substantially horizontal distance from the source region 302. The gate oxide 402 may represent an exemplary embodiment of the gate oxide 310, the gate oxide 332, or the gate oxide 342 to provide some examples. As such, the gate oxide 402 may include a first gate oxide, such as the first gate oxide 324, the first gate oxide 334, or the first gate oxide 344 to provide some examples, and a second gate oxide, such as, the second gate oxide 326, the second gate oxide 336, or the second gate oxide 346 to provide some examples. More specifically, the CMOS logic foundry technology may be used to fabricate the first side 350A of the gate region 306 and/or a first side 404A of the gate oxide 402 at a substantially horizontal distance of approximately 0.24 μm from the second side 352B of the source region 302.

The second side 358B of the p-well 310 and an oxide junction 406 may be formed at a second substantially horizontal distance from the source region 302. The oxide junction 406 represents a region in the gate oxide 402 where the first gate oxide comes into substantial contact with the second gate oxide. More specifically, the CMOS logic foundry technology may fabricate the oxide junction 406 at a distance of approximately 0.44 μm from the second side 352B of the source region 302 such that the oxide junction 406 is approximately 0.2 μm from the first side 404A of the first gate oxide as shown in FIG. 3A. Alternatively, the CMOS logic foundry technology may fabricate the oxide junction 406 at a distance of approximately less than 0.44 μm from the second side 352B of the source region 302 such that the oxide junction 406 is less than 0.2 μm from the first side 404A of the first gate oxide as shown in FIG. 3B. In another alternate, the CMOS logic foundry technology may fabricate the oxide junction 406 at a distance of approximately more than 0.44 μm from the second side 352B of the source region 302 such that the oxide junction 406 is more than 0.2 μm from the first side 404A of the first gate oxide as shown in FIG. 3C.

The second side 350B of the gate region 306 and/or a second side 404B of the gate oxide 402 may be formed at a third substantially horizontal distance from the source region 302. More specifically, the CMOS logic foundry technology may be used to fabricate the second side 350B of the gate region 306 and/or the second side 404A of the gate oxide 402 at a substantially horizontal distance of approximately 0.64 μm from the second side 352B of the source region 302.

B. High κ Gate Oxide Architecture Using Conventional CMOS Logic Foundry Technology FIG. 5 illustrates a fourth cross-sectional view of the n-type LDMOS according to a fourth exemplary embodiment of the present invention. A conventional CMOS logic foundry technology forms an n-type LDMOS structure 500 onto the substrate 102 of one conductivity type. The n-type LDMOS structure 500 is substantially similar to the n-type LDMOS structure 100 as described above. Therefore, only differences between the n-type LDMOS structure 100 and the n-type LDMOS structure 500 are to be described in further detail.

A region consisting of one or more metals represents a gate region 502 of the n-type LDMOS structure 500. The gate region 502 may be formed using one or more metals such as, but not limited to, TiN, TaSiN, WN, TaN, or TaCx to provide some examples. As shown in FIG. 5, the gate region 502 is positioned between the source region 104 and the drain region 106. More specifically, a first side 550A of the gate region 502 may be formed above the source region 104 such that the source region 104 substantially overlaps the gate region 502. In other words, a first side 152A of the source region 104 may extend beyond the first side 550A of the gate region 502 such that at least some of the source region 104 is below at least some of the gate region 502. Alternatively, the first side 550A of the gate region 502 may be substantially vertically aligned with the first side 152A of the source region 104 such that no substantial overlap exists between the source region 104 and the gate region 502. In another alternate, the first side 152A of the source region 104 may be positioned prior to the first side 550A of the gate region 502 such that none of the source region 104 is below the gate region 502. In other words, a substantially horizontal distance separates the first side 550A of the gate region 502 with the first side of the source region 104. The gate region 502 extends from the first side 550A to a second side 550B.

To mimic the increased breakdown voltage of the thick gate oxide, without the increase in size of the conventional LDMOS device, as described above, a gate oxide 504 of the n-type LDMOS structure 500 uses a high dielectric constant (high-κ dielectric) gate oxide having a thickness approximately equal to the thin gate oxide of the low operating voltage process. In an exemplary embodiment, the thickness of the gate oxide 504 is approximately 20 Å. A high-κ dielectric refers to an insulating material having a dielectric constant larger than $SiO_2$. The gate oxide 504 may be formed using one or more high-κ dielectric materials having a dielectric constant between 10 and 30 such as, but not limited to, hafnium silicate, zirconium silicate, hafnium dioxide and zirconium dioxide to provide some examples.

As shown in FIG. 5, the gate oxide 504 is positioned between the source region 104 and the drain region 106 and below the gate oxide 504. More specifically, a first side 552A of the gate oxide 504 may be formed above the source region 104 such that the source region 104 substantially overlaps the gate oxide 504. In other words, a first side 152A of the source region 104 may extend beyond the first side 552A of the gate oxide 504 such that at least some of the source region 104 is below at least some of the gate oxide 504. Alternatively, the first side 552A of the gate oxide 504 may be substantially vertically aligned with the first side 152A of the source region 104 such that no substantial overlap exists between the source region 104 and the gate oxide 504. In another alternate, the first side 152A of the source region 104 may be positioned prior to the first side 552A of the gate oxide 504 such that none of the source region 104 is below the gate oxide 504. In other words, a substantially horizontal distance separates the first side 552A of the gate oxide 504 with the first side of the source region 104. The gate oxide 504 extends from the first side 552A to a second side 552B.

FIG. 6 illustrates a fourth cross-sectional view of the p-type LDMOS according to a fourth exemplary embodiment of the present invention. A conventional CMOS logic foundry technology forms a p-type LDMOS structure 600 onto the substrate 102 of one conductivity type. The p-type LDMOS structure 600 is substantially similar to the p-type LDMOS structure 300 as described above. Therefore, only differences between the p-type LDMOS structure 300 and the p-type LDMOS structure 600 are to be described in further detail.

A region consisting of one or more metals represents a gate region 602 of the n-type LDMOS structure 600. The gate region 602 may be formed using one or more metals such as, but not limited to, TiN, TaSiN, WN, TaN, or TaCx to provide some examples. As shown in FIG. 6, the gate region 602 is positioned between the source region 302 and the drain region 304. More specifically, a first side 650A of the gate region 602 may be formed above the source region 302 such that the source region 302 substantially overlaps the gate region 602. In other words, a first side 352A of the source region 302 may extend beyond the first side 650A of the gate region 602 such that at least some of the source region 302 is below at least some of the gate region 602. Alternatively, the first side 650A of the gate region 602 may be substantially vertically aligned with the first side 352A of the source region 302 such that no substantial overlap exists between the source region 302 and the gate region 602. In another alternate, the first side 352A of the source region 302 may be positioned prior to the first side 650A of the gate region 602 such that none of the source region 302 is below the gate region 602. In other words, a substantially horizontal distance separates the first side 650A of the gate region 602 with the first side of the source region 302. The gate region 602 extends from the first side 650A to a second side 650B.

To mimic the increased breakdown voltage of the thick gate oxide, without the increase in size of the conventional LDMOS device, as described above, a gate oxide 604 of the n-type LDMOS structure 600 uses a high dielectric constant (high-κ dielectric) gate oxide having a thickness approximately equal to the thin gate oxide of the low operating voltage process. In an exemplary embodiment, the thickness of the gate oxide 604 is approximately 20 Å. A high-κ dielectric refers to an insulating material having a dielectric constant larger than $SiO_2$. The gate oxide 604 may be formed using one or more high-κ dielectric materials having a dielectric constant between 10 and 30 such as, but not limited to, hafnium silicate, zirconium silicate, hafnium dioxide and zirconium dioxide to provide some examples.

As shown in FIG. 6, the gate oxide 604 is positioned between the source region 302 and the drain region 304 and below the gate oxide 604. More specifically, a first side 652A of the gate oxide 604 may be formed above the source region 302 such that the source region 302 substantially overlaps the gate oxide 604. In other words, a first side 352A of the source region 302 may extend beyond the first side 652A of the gate oxide 604 such that at least some of the source region 302 is below at least some of the gate oxide 604. Alternatively, the first side 652A of the gate oxide 604 may be substantially vertically aligned with the first side 352A of the source region 302 such that no substantial overlap exists between the source region 302 and the gate oxide 604. In another alternate, the first side 352A of the source region 302 may be positioned prior to the first side 652A of the gate oxide 604 such that none of the source region 302 is below the gate oxide 604. In other words, a substantially horizontal distance separates the first side 652A of the gate oxide 604 with the first side of the source region 302. The gate oxide 604 extends from the first side 652A to a second side 652B.

It should be noted that the Split Gate Oxide Architecture may be combined with the High κ Gate Oxide Architecture to form a LDMOS having a split gate oxide with a first portion and a second portion, the first portion and the second portion being formed with the high κ gate oxide.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present invention. Thus, the present invention should not be limited by any of the above-described exemplary embodiments, but should be defined only in accordance with the following claims and their equivalents.

What is claimed is:

1. A semiconductor device formed within a semiconductor substrate of a first type, comprising:
    a source region of a second type, the second type being different from the first type;
    a drain region of the second type;
    a gate region of the second type positioned between the source region and the drain region;
    a gate oxide region in contact with the gate region, the gate oxide region including a first portion having a first thickness and a second portion having a second thickness, the first thickness being greater than the second thickness;
    a first well region of the second type positioned between the gate region and the drain region, the first well region overlapping the gate region by a first length; and
    a second well region of the first type positioned between the source region and the gate region.

2. The semiconductor device of claim 1, wherein the first type is p-type material and the second type is n-type material.

3. The semiconductor device of claim 1, wherein the first type is n-type material and the second type is p-type material.

4. The semiconductor device of claim 1, further comprising:
    a shallow trench isolation (STI) region positioned between the gate region and the drain region.

5. The semiconductor device of claim 4, wherein the STI region includes a first side substantially vertically aligned with a first side of the gate region and a second side adjacent to a first side of the drain region.

6. The semiconductor device of claim 5, wherein the second side is in substantial contact with the first side of the drain region.

7. The semiconductor device of claim 1, wherein the semiconductor device is formed using a logic foundry technology having a low operating voltage process and a high operating voltage process, and wherein the first thickness is approximately equal to a thickness of a thin gate oxide of the low operating voltage process.

8. The semiconductor device of claim 7, wherein the second thickness is approximately equal to a thickness of a thick gate oxide of the high operating voltage process.

9. The semiconductor device of claim 1, wherein the first thickness is approximately 20 angstrom (Å) and the second thickness is approximately 40 Å.

10. The semiconductor device of claim 1, wherein the first portion includes a first side side in contact with a first side of the second portion to form an oxide junction.

11. The semiconductor device of claim 10, wherein the first portion includes a second side substantially vertically aligned with a first side of the gate region and the second portion includes a second side substantially vertically aligned with a second side of the gate region.

12. The semiconductor device of claim 10, wherein the oxide junction is in substantial contact with the second well region.

13. The semiconductor device of claim 1, wherein the first portion includes a second length and the second portion includes a third length, the second length being substantially equal to the third length.

14. The semiconductor device of claim 1, wherein the first portion includes a second length and the second portion includes a third length, the second length being greater than the third length.

15. The semiconductor device of claim 1, wherein the first portion includes a second length and the second portion includes a third length, the second length being less than the third length.

16. The semiconductor device of claim 1, wherein the first well region is in contact with the second well region in a region of the semiconductor substrate positioned beneath the first portion.

17. The semiconductor device of claim 1, wherein the first portion is in contact with the second portion to form an oxide junction, the oxide junction being positioned above the second well region.

18. The semiconductor device of claim 1, wherein the first well region overlaps the gate region by a first length, and wherein the first portion includes a second length, the second length being greater than the first length.

19. The semiconductor device of claim 18, wherein the second length is a substantially horizontal length from a first side of the first portion to a second side of the first portion.

20. A semiconductor device, comprising:
  a gate region of a first type formed onto a semiconductor substrate of a second type, the gate region including a first heavily implanted region, the first type being different from the second type;
  a first well region of the first type and a second well region of the second type formed within the semiconductor substrate, the gate region being heavily implanted relative to the first well region; and
  a gate oxide region formed onto the semiconductor substrate between the gate region and the well region, the gate oxide region including a first portion having a first thickness and a second portion having a second thickness, the first thickness being greater than the second thickness,
  wherein the first well region is configured to contact the second well region in a region of the semiconductor substrate positioned beneath the first portion.

21. The semiconductor device of claim 16, further comprising:
  a source region of the first type including a second heavily implanted region formed within the semiconductor substrate; and
  a drain region of the first type including a third heavily implanted region formed within the semiconductor substrate, the source region and the drain region being heavily implanted relative to the first well region.

22. The semiconductor device of claim 20, wherein the first type is n-type material and the second type is p-type material.

23. The semiconductor device of claim 20, wherein the first type is p-type material and the second type is n-type material.

24. The semiconductor device of claim 20, further comprising:
  a shallow trench isolation (STI) region having a first side substantially vertically aligned with a first side of the gate region.

25. The semiconductor device of claim 20, wherein the semiconductor device is formed using a logic foundry technology having a low operating voltage process and a high operating voltage process, and wherein the first thickness is approximately equal to a thickness of a thin gate oxide of the low operating voltage process.

26. The semiconductor device of claim 25, wherein the second thickness is approximately equal to a thickness of a thick gate oxide of the high operating voltage process.

27. The semiconductor device of claim 20, wherein the first thickness is approximately 20 angstrom (Å) and the second thickness is approximately 40 Å.

28. The semiconductor device of claim 20, wherein the first portion includes a first side in contact with a first side of the second portion to form an oxide junction.

29. The semiconductor device of claim 28, wherein the first portion includes a second side substantially vertically aligned with a first side the gate region and the second portion includes a second side substantially vertically aligned with a second side of the gate region.

30. The semiconductor device of claim 28, wherein the oxide junction is in substantial contact with the second well region.

31. The semiconductor device of claim 20, wherein the first portion includes a first length and the second portion includes a second length, the first length being substantially equal to the second length.

32. The semiconductor device of claim 20, wherein the first portion includes a first length and the second portion includes a second length, the first length being greater than the second length.

33. The semiconductor device of claim 20, wherein the first portion includes a first length and the second portion includes a second length, the first length being less than the second length.

34. The semiconductor device of claim 20, wherein the first well region is in contact with the second well region in a region of the semiconductor substrate positioned beneath the first portion.

35. The semiconductor device of claim 20, wherein the first portion is in contact with the second portion to form an oxide junction, the oxide junction being positioned above the second well region.

36. The semiconductor device of claim 20, wherein the first well region overlaps the gate region by a first length, and wherein the first portion includes a second length, the second length being greater than the first length.

37. The semiconductor device of claim 20, wherein the second length is a substantially horizontal length from a first side of the first portion to a second side of the first portion.

* * * * *

UNITED STATES PATENT AND TRADEMARK OFFICE
CERTIFICATE OF CORRECTION

| | | |
|---|---|---|
| PATENT NO. | : 8,203,188 B2 | |
| APPLICATION NO. | : 12/457745 | |
| DATED | : June 19, 2012 | |
| INVENTOR(S) | : Akira Ito | |

It is certified that error appears in the above-identified patent and that said Letters Patent is hereby corrected as shown below:

At Title page, item (75) Inventor, please replace "Akiro Ito" with --Akira Ito--.

At column 19, line 22, please replace "first side side" with --first side--.

At column 20, line 49, please replace "first side the gate region" with --first side of the gate region--.

Signed and Sealed this
Thirty-first Day of July, 2012

David J. Kappos
*Director of the United States Patent and Trademark Office*